(12) United States Patent
Gong et al.

(10) Patent No.: US 11,886,085 B2
(45) Date of Patent: Jan. 30, 2024

(54) DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xuerui Gong, Beijing (CN); Yong Yu, Beijing (CN); Chang Zhang, Beijing (CN); Jiangsheng Wang, Beijing (CN)

(73) Assignees: CHENGDU BOE OPTOELECTRONICS TECHNOLOGY CO., LTD., Sichuan (CN); BOE TECHNOLOGY DROUP CO., LTD., Beijing (CN)

( * ) Notice: Subject to any disclaimer, the term of this patent is extended or adjusted under 35 U.S.C. 154(b) by 368 days.

(21) Appl. No.: 17/427,420

(22) PCT Filed: Oct. 22, 2020

(86) PCT No.: PCT/CN2020/122972
§ 371 (c)(1),
(2) Date: Jul. 30, 2021

(87) PCT Pub. No.: WO2022/082651
PCT Pub. Date: Apr. 28, 2022

(65) Prior Publication Data
US 2022/0317529 A1    Oct. 6, 2022

(51) Int. Cl.
G02F 1/1362    (2006.01)
G02F 1/1368    (2006.01)

(52) U.S. Cl.
CPC ...... G02F 1/136286 (2013.01); G02F 1/1368 (2013.01); G02F 1/136222 (2021.01)

(58) Field of Classification Search
CPC ......... G02F 1/136286; G02F 1/136222; G02F 1/1368; H01L 23/488; H01L 24/01; H01L 27/12
USPC ......................................................... 349/33
See application file for complete search history.

(56) References Cited

FOREIGN PATENT DOCUMENTS

KR    20150054454 A    *    5/2015

* cited by examiner

Primary Examiner — Edward J Glick
Assistant Examiner — William D Peterson
(74) Attorney, Agent, or Firm — Lippes Mathias LLP (57) ABSTRACT

Provided is an array substrate. The array substrate includes: a base substrate, and a plurality of gate lines, a plurality of data lines, a plurality of sub-pixels and a plurality of touch signal lines disposed on the base substrate. The data lines have a plurality of first extending parts and a plurality of second extending parts which are in an alternating arrangement. When the array substrate is used to prepare a liquid crystal display panel and the liquid crystal display panel is displaying, in each column of the sub-pixels, the voltage polarities of the two adjacent sub-pixels which respectively belong to two adjacent first pixel regions are opposite.

20 Claims, 4 Drawing Sheets

DISPLAY DEVICE

CROSS-REFERENCE TO RELATED APPLICATIONS

This application is a 371 of PCT Application No. PCT/CN2020/122972, filed on Oct. 22, 2020, the disclosure of which is herein incorporated by reference in its entirety.

TECHNICAL FIELD

The present disclosure relates to the field of display devices, and in particular relates to a display device.

BACKGROUND

Mobile phones, displays, etc. are common display devices in life that can display abundant image information.

A display device includes a display panel and a circuit connector that may be a chip on film (COF) or a flexible printed circuit (FPC). The display panel is usually provided with a bonding region disposed at the edge. The COF or the FPC is bonded to the bonding region of the display panel.

SUMMARY

Embodiments of the present disclosure provide a display device, including a display panel and a circuit connector bonded to the display panel;

wherein the circuit connector includes a flexible substrate and a bonding structure, and an edge of the flexible substrate is provided with a first bonding region;

the bonding structure is disposed in the first bonding region and includes a first row of pads and a second row of pads; wherein the first row of pads include a plurality of first pads arranged along the edge of the flexible substrate; the second row of pads are disposed on a side, proximal to a middle portion of the flexible substrate, of the flexible substrate, and the second row of pads include a plurality of second pads arranged in a direction in which the plurality of first pads are arranged;

in a first direction, a length of the first pad is less than a length of the second pad, and the first direction is a direction in which the first row of pads and the second row of pads are arranged;

an edge of the display panel is provided with a second bonding region bonded to the first bonding region; wherein orthographic projections of the plurality of first pads onto the display panel fall within the second bonding region; and a third row of pads and a fourth row of pads are distributed in the second bonding region; wherein the third row of pads include a plurality of third pads connected to the plurality of first pads in one-to-one correspondence; the fourth row of pads include a plurality of fourth pads connected to the plurality of second pads in one-to-one correspondence; and in the first direction, a length of the third pad is equal to a length of the fourth pad.

Optionally, in the first direction, a ratio of the length of the first pad to the length of the second pad ranges from 8:10 to 9:10.

Optionally, in the first direction, the ratio of the length of the first pad to the length of the second pad is 8:9.

Optionally, in the first direction, the length of the first pad is 800 μm, and the length of the second pad is 900 μm.

Optionally, in the first direction, a ratio of a distance between the first row of pads and the second row of pads to the length of the first pad ranges from 1:10 to 1.5:10.

Optionally, in the direction in which the plurality of first pads are arranged, a distance between adjacent first pads disposed in middle of the first row of pads is greater than a distance between adjacent first pads disposed at two sides of the first row of pads; and in the direction in which the plurality of second pads are arranged, a distance between adjacent second pads disposed in middle of the second row of pads is greater than a distance between adjacent second pads disposed at two sides of the second row of pads.

Optionally, in the first direction, a ratio of the distance between the first row of pads and the second row of pads to a distance between the third row of pads and the fourth row of pads ranges from 2:5 to 3:5.

Optionally, in the first direction, a ratio of the length of the third pad to the length of the first pad ranges from 7:20 to 8:20, and a ratio of the length of the fourth pad to the length of the second pad ranges from 3:10 to 4:10.

Optionally, in a direction in which the plurality of third pads are arranged, the adjacent third pads are uniformly spaced; and in a direction in which the plurality of fourth pads are arranged, the adjacent fourth pads are uniformly spaced.

Optionally, in a second direction, a width of the third pad is greater than a width of the first pad, and a width of the fourth pad is greater than a width of the second pad, the second direction being parallel to a surface of the flexible substrate and perpendicular to the first direction.

Optionally, in the second direction, the width of the first pad is 13 μm, and the width of the second pad is 13 μm.

Optionally, an included angle between a lengthwise direction of the first pad and the first direction ranges from 0 to 10°, and the plurality of first pads are symmetrically distributed about a center line of the first bonding region, the center line being extended in the first direction; and an included angle between a lengthwise direction of the second pad and the first direction ranges from 0 to 10°, and the plurality of second pads are symmetrically distributed about the center line of the first bonding region.

Optionally, extension lines of the plurality of first pads in the lengthwise direction of the first pad are intersected at one point; and extension lines of the plurality of second pads in the lengthwise direction of the first pad are intersected at one point.

Optionally, the flexible substrate is cover with a solder resist covers disposed outside the first bonding region, and an orthographic projection of the solder resist onto a plane where the display panel is disposed falls outside the display panel.

Optionally, the circuit connector is a COF or an FPC.

Optionally, a drive integrated circuit is disposed on the display panel or the COF; and the drive integrated circuit is a quad high-definition integrated circuit (QHD-IC).

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

In order to make the objects, technical solutions, and advantages of the present disclosure clearer, the following further describes the embodiments of the present disclosure in detail with reference to the accompanying drawings.

Unless otherwise defined, technical terms or scientific terms used in the present disclosure shall be of ordinary meaning as understood by those of ordinary skill in the art to which the present disclosure pertains. The term "first" or "second" or a similar term used in the present disclosure does not denote any order, quantity, or importance, but is merely used to distinguish different components. Similarly, the term "a" or "an" or the like is not intended to limit the number, but to denote the number of at least one. The term "comprise" or "include", or the like is intended to mean that elements or items which appear before the term include the elements or items listed after the term and their equivalents, and do not exclude other elements or items. The term "connection" or "connected to" or a similar term is not limited to a physical or mechanical connection but may include an electrical connection that is direct or indirect. The terms "upper", "lower", "left", "right" and the like are only used to indicate the relative positional relationship, and when the absolute position of a described object changes, the relative positional relationship may also change accordingly.

Figure 1:
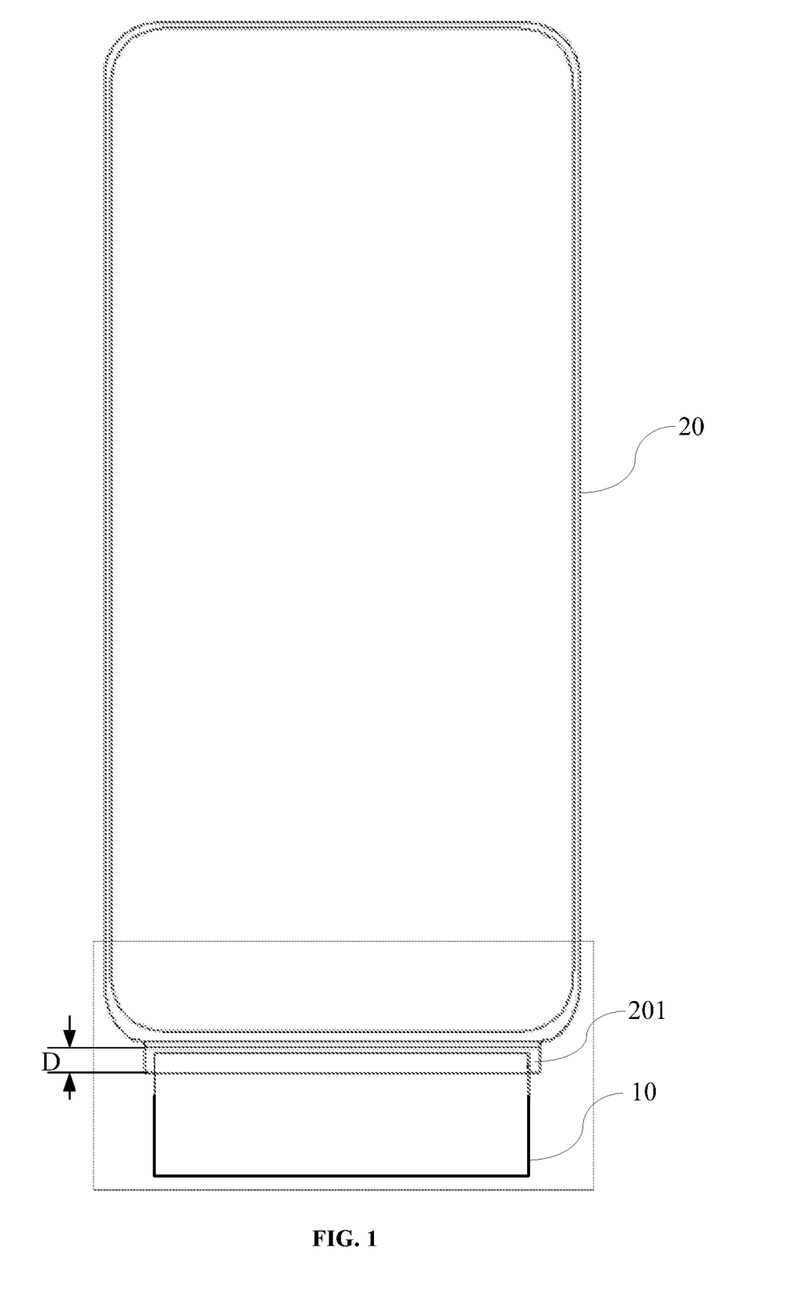
FIG. 1 is a top view of a display device in the related art.

FIG. 1 is a top view of a display device in the related art. As shown in FIG. 1, the display device includes a display panel 20 and a circuit connector bonded to the display panel 20. The circuit connector herein may be a COF or an FPC. For example, as shown in FIG. 1, the COF 10 is bonded to the display panel 20.

The display device usually includes a display device with a COF packaging process and a display device with a chip on panel (COP) packaging process. A display drive integrated circuit (IC) 14 of the display device with the COF packaging process is disposed on the COF 10; one end of the COF 10 is bonded to the display panel 20, and the other end of the COF 10 is bonded to a circuit board; and the circuit board may be a printed circuit board (PCB) or an FPC. A drive IC 14 of the display device with the COP packaging process is disposed on the display panel 20; and the display panel 20 is directly bonded to the FPC.

Figure 2:
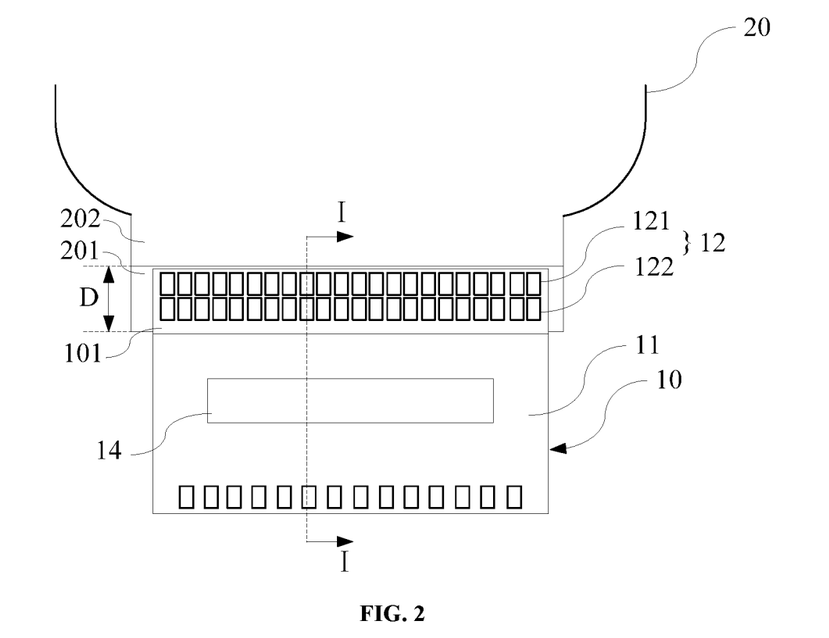
FIG. 2 is a partially enlarged schematic diagram within the dotted line in FIG. 1.

FIG. 2 is a partially enlarged schematic diagram within the dotted line in FIG. 1. As shown in FIG. 2, the embodiment of the present disclosure takes a display device with the COF packaging process as an example for illustration.

Figure 3:
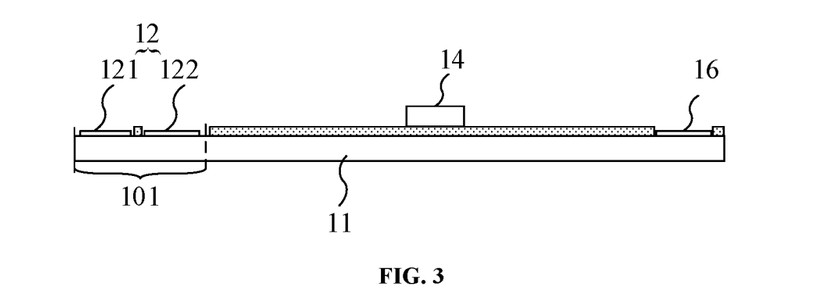
FIG. 3 is a sectional diagram of a COF.

FIG. 3 is a sectional (i.e., I-I section in FIG. 2) view of a COF. Referring to FIG. 2 and FIG. 3, the COF 10 includes a flexible substrate 11 and a bonding structure 12. An edge on one side of the flexible substrate 11 is provided with a first bonding region 101, and the bonding structure 12 is disposed in the first bonding region 101. The bonding structure 12 includes a plurality of first pads 121 and a plurality of second pads 122. The first pads 121 and the second pads 122 are disposed on a metal wiring layer of the COF and exposed through an opening in a protective layer, and thus electrically connected to the display panel 20.

Figure 4:
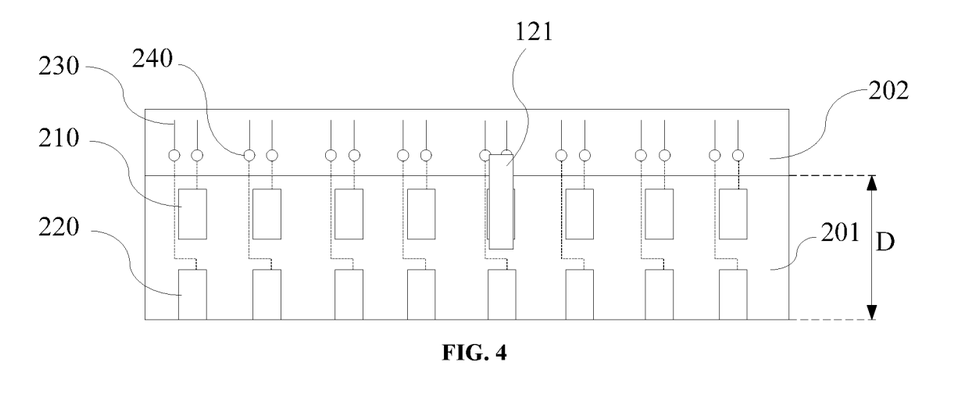
FIG. 4 is a partial structural schematic diagram of a display panel.

FIG. 4 is a partial structural schematic diagram of a display panel. As shown in FIG. 4, an edge on one side of the display panel 20 is provided with a second bonding region 201, and a wiring region 202 is disposed on the inner side (i.e., the side proximal to the middle portion of the display panel 20) of the second bonding region 201. A plurality of third pads 210 and a plurality of fourth pads 220 are distributed in the second bonding region 201. A plurality of signal lines 230 is also distributed on the display panel 20. The third pads 210 and the fourth pads 220 are respectively connected to the signal lines 230, and the signal lines 230 extend from the second bonding region 201 to the wiring region 202. The same signal line 230 may include two sections, one section is disposed on a surface of the display panel 20, the other section is disposed inside the display panel 20, and the two sections are connected via a through hole 240. The distribution of the signal lines 230 and the through holes 240 shown in FIG. 4 is merely intended for illustration, and for different display panels, the signal lines 230 and the through holes 240 are distributed differently.

The first bonding region 101 is bonded to the second bonding region 201, the plurality of first pads 121 and the plurality of third pads 210 are connected in one-to-one correspondence, and the plurality of second pads 122 and the plurality of fourth pads 220 are connected in one-to-one correspondence.

In the related art, in order to further reduce a frame of the display device and increase a cutting rate of the display panel, a width D of the second bonding region 201 has to be set smaller, such that the first pads 121 may partially enter the wiring region 202 during bonding. Referring to FIG. 4, a first pad 121 that partially enters the wiring region 202 is schematically shown. The portion of the first pad 121 that enters the wiring region 202 may be in contact with the through hole 240, causing the signal line 230 to be short-circuited.

Figure 5:
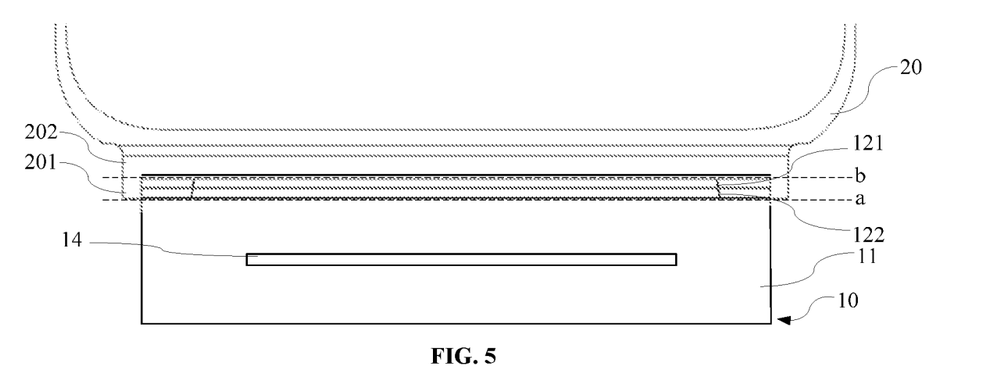
FIG. 5 is a schematic structural diagram of a display device according to an embodiment of the present disclosure.

FIG. 5 is a schematic structural diagram of a display device according to an embodiment of the present disclosure. The display device may be any product or component having a display function, such as a mobile phone, a tablet computer, a television, a display, a notebook computer, a digital photo frame or a navigator. As shown in FIG. 5, the display device includes a display panel 20 and a circuit connector bonded and connected to the display panel 20. The circuit connector in the embodiment of the present disclosure may be a COF or an FPC. In the following embodiments, the solution of the present disclosure is explained by taking that the circuit connector is a COF 10 as an example.

Figure 6:
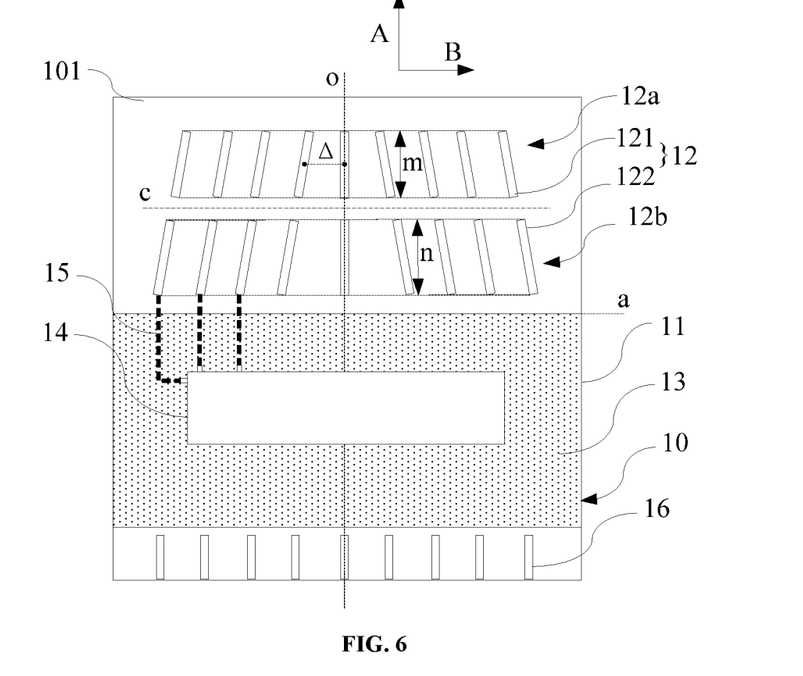
FIG. 6 is a partial structural schematic diagram of a COF according to an embodiment of the present disclosure.

FIG. 6 is a partial structural schematic diagram of a COF according to an embodiment of the present disclosure. As shown in FIG. 6, the COF 10 includes a flexible substrate 11 and a bonding structure 12, and at an edge of the flexible substrate 11 is provided with a first bonding region 101.

The bonding structure 12 is disposed in the first bonding region 101 and includes a first row of pads 12a and a second row of pads 12b. The first row of pads 12a include a plurality of first pads 121 arranged along the edge of the flexible substrate 11, the second row of pads 12b are disposed on a side, proximal to the middle portion of the flexible substrate 11, of the first row of pads 12a and include a plurality of second pads 122 arranged in a direction in which the plurality of first pads 121 are arranged.

In a first direction A, a length m of the first pad 121 is less than a length n of the second pad 122. The first direction A is a direction in which the first row of pads 12a and the second row of pads 12b are arranged.

An edge of the display panel 20 is provided with a second bonding region 201. The dotted line b in FIG. 5 is a boundary between the second bonding region 201 and a wiring region 202.

Figure 7:
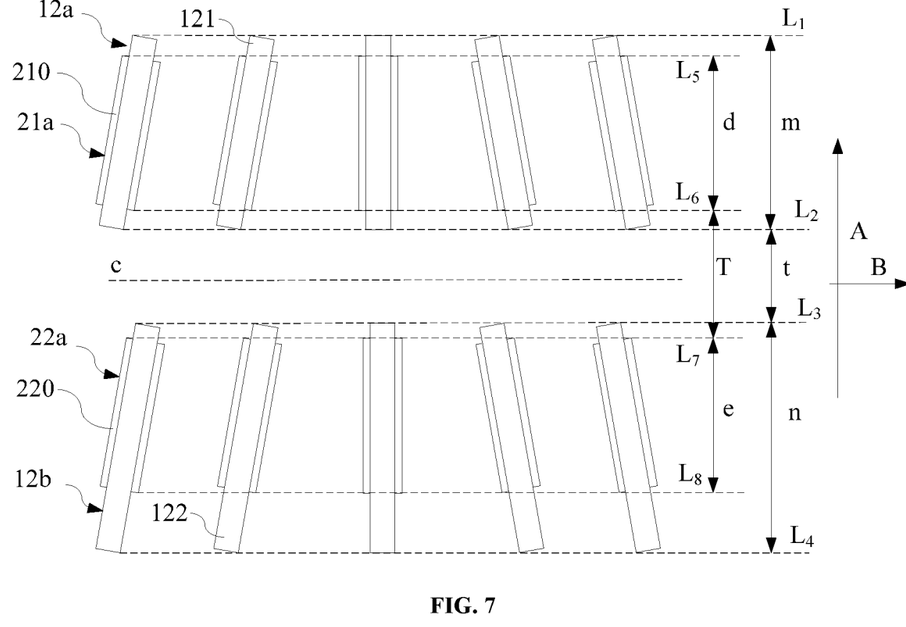
FIG. 7 is a schematic diagram of bonding a first bonding region to a second bonding region according to an embodiment of the present disclosure.

The first bonding region 101 is bonded to the second bonding region 201, and orthographic projections of the plurality of first pads 121 onto the display panel 20 fall within the second bonding region 201. A third row of pads 21a and a fourth row of pads 22a are distributed in the second bonding region 201. FIG. 7 is a schematic diagram of bonding a first bonding region to a second bonding region according to an embodiment of the present disclosure. As shown in FIG. 7, the third row of pads 21a include a plurality of third pads 210 connected to the plurality of first pads 121 in one-to-one correspondence, and the fourth row of pads 22a include a plurality of fourth pads 220 connected to the plurality of second pads 122 in one-to-one correspondence. In one embodiment of the present disclosure, in the first direction A, a length d of the third pad 210 is equal to a length e of the fourth pad 220.

The COF 10 is usually connected to the display panel 20 during an outer lead bonding (OLB) process. In the process, an anisotropic conductive film (ACF) is disposed between surfaces to be in contact of the COF 10 and the display panel 20. The first bonding region 101 refers to a region, which is in contact with the ACF, on the COF 10, and the second bonding region 201 refers to a region, which is in contact with the ACF, on the display panel 20.

When the first bonding region is bonded to the second bonding region, the first pads are shorter than the second pads, which helps to prevent the first pads from extending to a wiring region of the display panel and to ensure that orthographic projections of the plurality of first pads onto the display panel fall within the second bonding region. Thus, the wiring region of the display panel is prevented from being short-circuited by the first pads.

As shown in FIG. 6, the flexible substrate 11 is covered with a solder resist 13 (e.g., a filling region in FIG. 6), the solder resist 13 is disposed outside the first bonding region 101, and an orthographic projection of the solder resist 13 onto a plane where the display panel 20 is disposed falls outside the display panel 20. In FIG. 5, the dotted line a is a distribution boundary of the solder resist 13. By making the orthographic projection of the solder resist on the plane where the display panel is disposed falls outside the display panel 20, the solder resist is not be in contact with the display panel 20 and thus does not adversely affect bonding. The orthographic projection of the solder resist 13 onto the plane where the display panel 20 is disposed refers to an orthographic projection of the solder resist when the flexible substrate 11 is flattened to be parallel to the plane where the display panel 20 is disposed.

In an exemplary embodiment, there may be a gap between the plurality of first pads 121 and an edge of the flexible substrate 11. For example, in FIG. 5, part of the flexible substrate 11 extends above a boundary b between the second bonding region 201 and the wiring region 202, and the plurality of first pads 121 is disposed below the boundary b between the second bonding region 201 and the wiring region 202. Since the region on the flexible substrate 11 outside the first bonding region 101 is insulated, the part of the flexible substrate 11 does not cause the wiring region 202 to be short-circuited.

Optionally, the display device further includes a drive IC 14, and the drive IC 14 is disposed on the COF 10 as shown in FIG. 5, or disposed on the display panel 20. The drive IC 14 is a QHD-IC. QHD is a screen resolution with a resolution of 2,560×1,440 which is more suitable for a hand-held mobile terminal, such as a mobile phone. Generally, for a display device with the QHD-IC, the bonding structure 12 of the COF 10 includes two rows of pads. In other examples of the present disclosure, the display device may also be provided with other drive ICs 14, and the bonding structure 12 includes two rows of pads.

As shown in FIG. 6, both the plurality of first pads 121 and the plurality of second pads 122 are connected to the drive IC 14 over signal lines 15. Three signal lines 15 are schematically shown in FIG. 6.

In an exemplary embodiment, a cross-sectional area of the signal line 15 is positively correlated with a length of the signal line 15. The greater the length of the signal line 15 is, the higher the resistance of the signal line 15 is. In the case of the same length, the larger the cross-sectional area is, the lower the resistance of the signal line 15 is. Setting the cross-sectional area of the relatively longer signal line 15 to be larger, and the cross-sectional area of the relatively shorter signal line 15 to be smaller can reduce the resistance difference between the different signal lines 15 and even make the resistance of the signal lines 15 equal.

Optionally, the flexible substrate 11 is a multi-layer substrate, i.e., the flexible substrate 11 includes insulating dielectric layers and conductive layers, which are laminated alternately. Different signal lines 15 may be disposed in the same or different conductive layers. When the numbers of the first pads 121 and the second pads 122 are large, more signal lines 15 need to be provided. By using the multi-layer substrate and disposing the signal lines 15 in the multiple conductive layers, the arrangement of the signal lines 15 may be facilitated. The signal lines 15 at different layers may also be connected via through holes.

The conductive layer may be made of a copper foil, or other conductive materials, such as gold and silver.

A plurality of fifth pads 16 may also be distributed on the flexible substrate 11. The plurality of fifth pads 16 is arranged along one side of the flexible substrate 11. In an inner lead bonding (ILB) process, the plurality of fifth pads 16 may be connected to other structures, e.g., a printed circuit board (PCB).

As shown in FIG. 6, both lengthwise directions of the plurality of first pads 121 and lengthwise directions of the plurality of second pads 122 form acute angles with the first direction A, and the first direction A is the direction in which the first row of pads 12a and the second row of pads 12b are arranged.

The orthographic projections of both the first pads 121 and the second pads 122 in the second bonding region 201 are rectangular. The lengthwise direction of the first pad 121 refers to an extension direction of a relatively long side edge in the orthographic projection of the first pad 121 in the second bonding region 201, and the lengthwise direction of the second pad 122 refers to an extension direction of a relatively long side edge in the orthographic projection of the second pad 122 in the second bonding region 201.

When the first bonding region 101 has the same width, the length of the first pad 121 may be appropriately increased by obliquely arranging the first pad 121 at a certain angle, such that the area of contact between the first pad 121 and the display panel 20 is increased, and the COF 10 is bonded to the display panel 20 more securely. The width of the first bonding region 101 refers to the width of the first bonding region 101 in the first direction A.

In an exemplary embodiment, an included angle between the lengthwise direction of the first pad 121 and the first direction ranges from 0 to 10°, the plurality of first pads 121 is symmetrically distributed about a center line o of the first bonding region 101, and the center line o is extended in the first direction A and is an axis of symmetry of the first bonding region 101. an included angle between the lengthwise direction of the second pad 122 and the first direction A ranges from 0 to 10°, and the plurality of second pads 122 is also symmetrically distributed about the center line o of the first bonding region 101.

Optionally, the included angle between the lengthwise direction of the first pad 121 and the first direction A and the included angle between the lengthwise direction of the second pad 122 and the first direction A may be gradually varied. Taking the plurality of first pads 121 as an example, in the direction in which the plurality of first pads 121 are arranged, the included angles between the lengthwise directions of the first pads 121 disposed in the middle of the first row of pads and the first direction A may be less than angles between the lengthwise directions of the first pads 121 disposed at two sides of the first row of pads and the first direction A.

In an example, extension lines of the plurality of first pads 121 in the lengthwise directions are intersected at one point, and extension lines of the plurality of second pads 122 in the lengthwise directions are intersected at one point, which may improve the bonding yield and the bonding reliability of the display device. The intersection point of the extension lines of the plurality of first pads 121 in the lengthwise directions and the intersection point of the extension lines of the plurality of second pads 122 in the lengthwise directions may be the same point or two different points.

In the first row of pads 12a, a distance A between the adjacent first pads 121 may be gradually varied, and the distance A herein is a length of a connecting line of geometric centers of adjacent first pads 121. For example, in the direction in which the plurality of first pads 121 are arranged, the distance A between adjacent first pads 121 disposed in the middle of the first row of pads may be greater than the distance A between adjacent first pads 121 disposed at two sides. In the direction in which the plurality of second pads 122 are arranged, a distance between adjacent second pads 122 disposed in the middle of the second row of pads is greater than a distance between adjacent second pads 122 disposed at two sides of the second row of pads.

As shown in FIG. 7, in the first direction A, a ratio of the length m of the first pad 121 to the length n of the second pad 122 may range from 8:10 to 9:10, i.e., a ratio of the length m to the length n may be 0.8 to 0.9. During bonding, usually a straight line (e.g., the straight line c in FIG. 7, which is kept equal distances away from a straight line $L_2$ and a straight line $L_3$) between the first row of pads 12a and the second row of pads 12b is aligned with a certain straight line on the display panel 20, so as to position the COF 10. In a case where the second pads 122 have the same length, the first pads 121 is excessively short if the ratio of the length of the first pad 121 to the length of the second pad 122 is excessively small in the first direction A, as a result of which the problem of poor bonding is likely to occur. The risk of a short circuit caused by that the first pad 121 enters the wiring region 202 of the display panel will be increased if the ratio of the length of the first pad 121 to the length of the second pad 122 is excessively large in the first direction A.

Two ends of the plurality of first pads 121 are generally aligned, and two ends of the plurality of second pads 122 are also aligned. For example, in FIG. 7, one ends of the plurality of first pads 121 are aligned with a straight line $L_1$, and the other ends of the plurality of first pads 121 are aligned with a straight line $L_2$. One ends of the plurality of second pads 122 are aligned with a straight line $L_3$, and the other ends of the plurality of second pads 122 are aligned with a straight line $L_4$. The straight lines $L_1$, $L_2$, $L_3$ and $L_4$ are parallel to one another and are all perpendicular to the first direction A. In the first direction A, the length m of the first pad 121 is a distance between the straight lines $L_1$ and $L_2$, and the length n of the second pad 122 is a distance between the straight lines $L_3$ and $L_4$.

In an exemplary embodiment of the present disclosure, in the first direction A, the ratio of the length m of the first pad 121 to the length n of the second pad 122 is 8:9. Using this ratio may take into account both the firmness of bonding and the risk of a short circuit.

In an exemplary embodiment, in the first direction A, the length m of the first pad 121 is 800 μm, and the length n of the second pad 122 is 900 μm.

In an exemplary embodiment, in a second direction B, a width of the first pad 121 may be 13 μm, a width of the second pad 122 may be 13 μm, and the second direction B is parallel to a surface of the flexible substrate 11 and is perpendicular to the first direction A. The widths of the plurality of first pads 121 may be equal to the widths of the plurality of second pads 122.

Taking the first pad 121 as an example, if the length of the first pad 121 in the first direction A is determined, the greater the width of the first pad 121 in the second direction B is, the larger the area of contact between the first pad 121 and the display panel 20 during bonding is, and the firmer the bonding is. However, when the first bonding region 101 is determined, the greater the width of the first bonding pad 121 is, the smaller a gap that may be reserved between the first pads 121 is, and the more likely it is that the first pads 121 will be short-circuited during bonding.

As shown in FIG. 7, in the first direction A, a ratio of a distance t between the first row of pads 12a and the second row of pads 12b to the length m of the first pad 121 ranges from 1:10 to 1.5:10, i.e., the ratio of the distance t to the length m may be 0.1 to 0.15. The distance t between the first row of pads 12a and the second row of pads 12b is equivalent to a distance between the straight line $L_2$ and the straight line $L_3$.

When the area of the first bonding region 101 is determined, the greater the distance t between the first row of pads 12a and the second row of pads 12b is, the less the lengths of the first pad 121 and the second pad 122 that may be arranged in the first direction A are, as a result of which the problem of poor bonding is likely to occur. However, when the distance t between the first row of pads 12a and the second row of pads 12b is excessively small, the risk of a short circuit between the first pad 121 and the second pad 122 will be increased during bonding.

In an exemplary embodiment of the present disclosure, a ratio of the distance t between the first row of pads 12a and the second row of pads 12b to the length m of the first pad 121 is 1:8. Using this ratio may take into account both the firmness of bonding and the risk of a short circuit.

In an exemplary embodiment, the distance t between the first row of pads 12a and the second row of pads 12b is 100 μm.

As shown in FIG. 7, on the display panel 20, a third row of pads 21a connected to the first row of pads 12a and a fourth row of pads 22a connected to the second row of pads 12b are distributed in the second bonding region 201.

The third row of pads 21a include a plurality of third pads 210 connected to the plurality of first pads 121 in one-to-one correspondence, and the fourth row of pads 22a include a plurality of second pads 122 connected to the plurality of second pads 122 in one-to-one correspondence.

Owing to the bonding process, the first pads 121 and the second pads 122 on the COF 10 are respectively connected to the third pads 210 and the fourth pads 220 on the display panel 20 in one-to-one correspondence.

A distance T between the third row of pads 21a and the fourth row of pads 22a may be greater than the distance t between the first row of pads 12a and the second row of pads 12b.

Two ends of the plurality of third pads 210 are generally aligned, and two ends of the plurality of fourth pads 220 are also aligned. For example, in FIG. 7, one ends of the plurality of third pads 210 are aligned with a straight line $L_5$, and the other ends of the plurality of third pads 210 are aligned with a straight line $L_6$. One ends of the plurality of fourth pads 220 are aligned with a straight line $L_7$, and the other ends of the plurality of fourth pads 220 are aligned with a straight line $L_8$. The straight lines $L_5$, $L_6$, $L_7$, and $L_8$ are parallel to one another and are all perpendicular to the first direction A. In the first direction A, a length d of the third pad 210 is a distance between the straight line $L_5$ and the straight line $L_6$, and a length e of the fourth pad 220 is a distance between the straight line $L_7$ and the straight line $L_8$.

In an exemplary embodiment, a ratio of the distance t between the first row of pads 12a and the second row of pads 12b to the distance T between the third row of pads 21a and the fourth row of pads 22a ranges from 2:5 to 3:5, i.e., the ratio of the distance t to the distance T may be 0.4 to 0.6.

In an embodiment of the present disclosure, the ratio of the distance t between the first row of pads 12a and the second row of pads 12b to the distance T between the third row of pads 21a and the fourth row of pads 22a is 1:2. The distance between the first row of pads 12a and the second row of pads 12b is 100 µm, and the distance between the third row of pads 21a and the fourth row of pads 22a is 200 µm.

As shown in FIG. 7, in the first direction A, a length d of the third pad 210 is less than the length m of the first pad 121, and a length e of the fourth pad 220 is less than the length n of the second pad 122.

Optionally, in the first direction A, a ratio of the length d of the third pad 210 to the length m of the first pad 121 ranges from 7:20 to 8:20, i.e., the ratio of the length d to the length m may be 0.35 to 0.4, and a ratio of the length e of the fourth pad 220 to the length n of the second pad 122 ranges from 3:10 to 4:10, i.e., the ratio of the length e to the length n may be 0.3 to 0.4.

In an exemplary embodiment, in the first direction A, a ratio of the length m of the first pad 121 to the length n of the second pad 122 to the length d of the third pad 210 to the length e of the fourth pad 220 is 8:9:6:6.

In an embodiment of the present disclosure, the length d of the third pad 210 is equal to the length e of the fourth pad 220, and both of them are 600 µm.

As shown in FIG. 7, in the second direction B, a width of the third pad 210 may be greater than the width of the first pad 121, and a width of the fourth pad 220 may be greater than the width of the second pad 122.

The plurality of third pads 210 may be of different widths, and the plurality of fourth pads 220 may also be of different widths. For example, in the first direction A, the widths of the third pads 210 disposed in the middle of the third row of pads 21a are greater than the widths of the third pads 210 disposed at two sides of the third row of pads 21a; and the widths of the fourth pads 220 disposed in the middle of the fourth row of pads 22a are greater than the widths of the fourth pads 220 disposed at two sides of the fourth row of pads 22a. Alternatively, the widths of the third pads 210 disposed in the middle of the third row of pads 21a are less than the widths of the third pads 210 disposed at two sides of the third row of pads 21a; and the widths of the fourth pads 220 disposed in the middle of the fourth row of pads 22a are less than the widths of the fourth pads 220 disposed at two sides of the fourth row of pads 22a.

In an exemplary embodiment, in the second direction B, an average width of the third pads 210 may be 20.5 µm, and an average width of the fourth pads 220 may be 20.5 µm. The average width of the third pads 210 refers to a ratio of the sum of the widths of all the third pads 210 to the number of the third pads 210, and the average width of the fourth pads 220 refers to a ratio of the sum of the widths of all the fourth pads 220 to the number of the fourth pads 220.

In a direction in which the plurality of third row of pads 21a are arranged, the adjacent third pads 210 may be uniformly spaced; and in a direction in which the plurality of fourth row of pads 22a are arranged, the adjacent fourth pads 21a may be uniformly spaced. The distance between the adjacent third pads 210 is a length of a connecting line of geometric centers of the adjacent third pads 210, and the distance between the adjacent fourth pads 220 is a length of a connecting line of geometric centers of the adjacent fourth pads 220.

Figure 8:
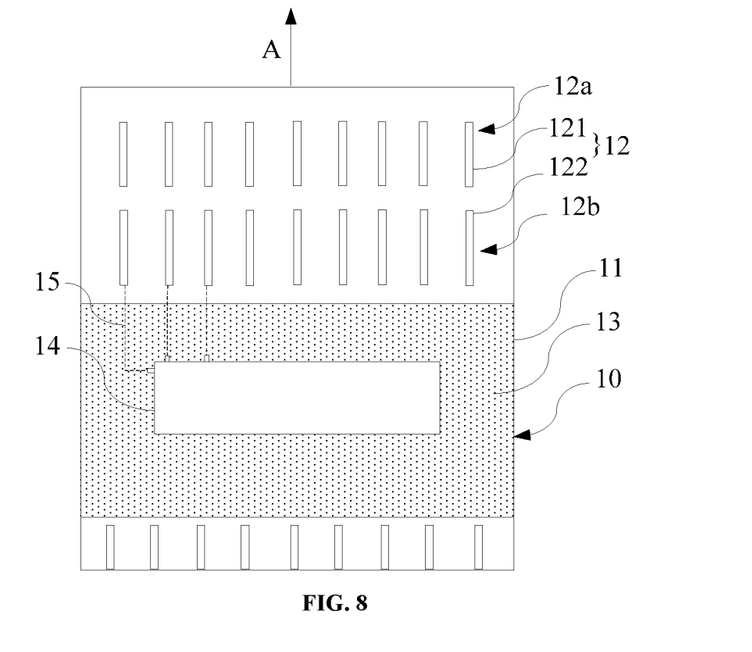
FIG. 8 is a schematic structural diagram of a display device according to another embodiment of the present disclosure.

Referring to FIG. 8, a schematic structural diagram of a display device according to another embodiment of the present disclosure. The display device differs from the display device shown in FIG. 6 in that in FIG. 8, both the lengthwise directions of the first pads 121 and the lengthwise directions of the second pads 122 are parallel to the first direction A.

The first pads 121 and the second pads 122 may be arranged in the fashion shown in FIG. 6 or FIG. 8 according to different display devices.

The above descriptions are merely optional embodiments of the present disclosure, and are not intended to limit the present disclosure. Any modifications, equivalent substitutions, improvements, and the like made within the spirits and principles of the present disclosure shall all fall within the protection scope of the present disclosure.

What is claimed is:

1. A display device, comprising a display panel and a circuit connector bonded to the display panel; wherein
   the circuit connector comprises a flexible substrate and a bonding structure, an edge of the flexible substrate being provided with a first bonding region;
   the bonding structure is disposed in the first bonding region and comprises a first row of pads and a second row of pads, wherein the first row of pads comprise a plurality of first pads arranged along the edge of the flexible substrate, the second row of pads are disposed on a side, proximal to a middle portion of the flexible substrate, of the first row of pads, and the second row of pads comprise a plurality of second pads arranged in a direction in which the plurality of first pads are arranged;

in a first direction, a length of the first pad is less than a length of the second pad, the first direction being a direction in which the first row of pads and the second row of pads are arranged; and an edge of the display panel is provided with a second bonding region bonded to the first bonding region, wherein orthographic projections of the plurality of first pads onto the display panel fall within the second bonding region, and a third row of pads and a fourth row of pads are distributed in the second bonding region, wherein the third row of pads comprise a plurality of third pads connected to the plurality of first pads in one-to-one correspondence, the fourth row of pads comprise a plurality of fourth pads connected to the plurality of second pads in one-to-one correspondence, and in the first direction, a length of the third pad is equal to a length of the fourth pad.

2. The display device according to claim 1, wherein in the first direction, a ratio of the length of the first pad to the length of the second pad ranges from 8:10 to 9:10.

3. The display device according to claim 2, wherein in the first direction, the ratio of the length of the first pad to the length of the second pad is 8:9.

4. The display device according to claim 3, wherein in the first direction, the length of the first pad is 800 μm, and the length of the second pad is 900 μm.

5. The display device according to claim 3, wherein in the first direction, a ratio of a distance between the first row of pads and the second row of pads to the length of the first pad ranges from 1:10 to 1.5:10.

6. The display device according to claim 1, wherein in the direction in which the plurality of first pads are arranged, a distance between adjacent first pads disposed in middle of the first row of pads is greater than a distance between adjacent first pads disposed at two sides of the first row of pads; and in the direction in which the plurality of second pads are arranged, a distance between adjacent second pads disposed in middle of the second row of pads is greater than a distance between adjacent second pads disposed at two sides the second row of pads.

7. The display device according to claim 1, wherein in the first direction, a ratio of a distance between the first row of pads and the second row of pads to a distance between the third row of pads and the fourth row of pads ranges from 2:5 to 3:5.

8. The display device according to claim 1, wherein in the first direction, a ratio of the length of the third pad to the length of the first pad ranges from 7:20 to 8:20, and a ratio of the length of the fourth pad to the length of the second pad ranges from 3:10 to 4:10.

9. The display device according to claim 8, wherein in a direction in which the plurality of third pads are arranged, adjacent third pads are uniformly spaced; and in a direction in which the plurality of fourth pads are arranged, the adjacent fourth pads are uniformly spaced.

10. The display device according to claim 8, wherein in a second direction, a width of the third pad is greater than a width of the first pad, and a width of the fourth pad is greater than a width of the second pad, the second direction being parallel to a surface of the flexible substrate and perpendicular to the first direction.

11. The display device according to claim 10, wherein in the second direction, the width of the first pad is 13 μm, and the width of the second pad is 13 μm.

12. The display device according to claim 1, wherein an included angle between a lengthwise direction of the first pad and the first direction ranges from 0 to 10°, and the plurality of first pads are symmetrically distributed about a center line of the first bonding region, the center line being extended in the first direction; and an included angle between a lengthwise direction of the second pad and the first direction ranges from 0 to 10°, and the plurality of second pads are symmetrically distributed about the center line of the first bonding region.

13. The display device according to claim 12, wherein extension lines of the plurality of first pads in the lengthwise direction of the first pad are intersected at one point; and extension lines of the plurality of second pads in the lengthwise direction of the second pad are intersected at one point.

14. The display device according to claim 1, wherein the flexible substrate is covered with a solder resist disposed outside the first bonding region, an orthographic projection of the solder resist onto a plane where the display panel is disposed falling outside the display panel.

15. The display device according to claim 1, wherein the circuit connector is a chip on film (COF) or a flexible printed circuit (FPC).

16. The display device according to claim 15, wherein a drive integrated circuit is disposed on the display panel or the COF, and the drive integrated circuit is a quad high-definition integrated circuit (QHD-IC).

17. The display device according to claim 2, wherein in the direction in which the plurality of first pads are arranged, a distance between adjacent first pads disposed in middle of the first row of pads is greater than a distance between adjacent first pads disposed at two sides of the first row of pads; and in the direction in which the plurality of second pads are arranged, a distance between adjacent second pads disposed in middle of the second row of pads is greater than a distance between adjacent second pads disposed at two sides the second row of pads.

18. The display device according to claim 2, wherein in the first direction, a ratio of a distance between the first row of pads and the second row of pads to a distance between the third row of pads and the fourth row of pads ranges from 2:5 to 3:5.

19. The display device according to claim 2, wherein in the first direction, a ratio of the length of the third pad to the length of the first pad ranges from 7:20 to 8:20, and a ratio of the length of the fourth pad to the length of the second pad ranges from 3:10 to 4:10.

20. The display device according to claim 2, wherein an included angle between a lengthwise direction of the first pad and the first direction ranges from 0 to 10°, and the plurality of first pads are symmetrically distributed about a center line of the first bonding region, the center line being extended in the first direction; and an included angle between a lengthwise direction of the second pad and the first direction ranges from 0 to 10°, and the plurality of second pads are symmetrically distributed about the center line of the first bonding region.

* * * * *

UNITED STATES PATENT AND TRADEMARK OFFICE
CERTIFICATE OF CORRECTION

| | | |
|---|---|---|
| PATENT NO. | : 11,886,085 B2 | Page 1 of 1 |
| APPLICATION NO. | : 17/427420 | |
| DATED | : January 30, 2024 | |
| INVENTOR(S) | : Xuerui Gong et al. | |

It is certified that error appears in the above-identified patent and that said Letters Patent is hereby corrected as shown below:

On the Title Page

The Assignees item (73) should read:
CHENGDU BOE OPTOELECTRONICS TECHNOLOGY CO., LTD., Sichuan (CN); BOE TECHNOLOGY GROUP CO., LTD., Beijing (CN)

Signed and Sealed this
Third Day of September, 2024

Katherine Kelly Vidal
*Director of the United States Patent and Trademark Office*